United States Patent [19]
Baumgartner et al.

[11] Patent Number: 6,074,426
[45] Date of Patent: Jun. 13, 2000

[54] METHOD FOR AUTOMATICALLY GENERATING BEHAVIORAL ENVIRONMENT FOR MODEL CHECKING

[75] Inventors: Jason Raymond Baumgartner; Nadeem Malik, both of Austin, Tex.

[73] Assignee: Interantional Business Machines Corporation, Armonk, N.Y.

[21] Appl. No.: 09/042,373

[22] Filed: Mar. 13, 1998

[51] Int. Cl.[7] .......................... G06F 17/50; G06F 11/263
[52] U.S. Cl. ............................................................... 703/13
[58] Field of Search ........................ 395/500.34; 703/13; 371/22.1, 24, 27.1

[56] References Cited

U.S. PATENT DOCUMENTS 5,946,481   8/1999   Kurshan et al. .................. 395/500.34

*Primary Examiner*—Kevin J. Teska
*Assistant Examiner*—Lonnie A. Knox
*Attorney, Agent, or Firm*—Robert V. Wilder; Volel Emile

[57] ABSTRACT

A method is provided for automatically enhancing verification of a design under test by using model checking on the state transitions captured during simulation. The enhanced verification is due to the fact that even though to all of the individual transitions captured were exercised during simulation, not all possible sequences of those transitions were necessarily exercised during the simulation, and the unexercised sequences may hide "bugs". The non-deterministic and exhaustive nature of the model checker ensures that all possible sequences comprising the captured state transitions are exercised. The methodology consists of utilizing the state transitions, and the inputs causing those state transitions as observed during simulation, to define legitimate input values that can be applied, nondeterministically and exhaustively, by the model checker to the design under test.

24 Claims, 4 Drawing Sheets

| STATE | LATCH 1 (N1) | LATCH 2 (N2) |
|---|---|---|
| a | 0 | 0 |
| b | 0 | 1 |
| c | 1 | 0 |
| d | 1 | 1 |

TRANSITION RELATION:

| PRESENT STATE | INPUT | NEXT STATE |
|---|---|---|
| a | 0 | b |
| b | 0 | c |
| c | 0 | d |
| c | 1 | a |
| d | 1 | a |
| a | 1 | c |

| CLOCK | 1 | 2 | 3 | 4 | 5 | 6 | 7 |
|---|---|---|---|---|---|---|---|
| TRACE 1 INPUT | 0 | 0 | 0 | 1 | 0 | 0 | 0 |
| TRACE 1 STATE | a | b | c | d | a | b | c |
| TRACE 2 INPUT | 1 | 1 | 1 | 0 | | | |
| TRACE 2 STATE | a | c | a | b | | | |

METHOD FOR AUTOMATICALLY GENERATING BEHAVIORAL ENVIRONMENT FOR MODEL CHECKING

FIELD OF THE INVENTION

The present invention relates generally to information processing systems and more particularly to automated formal verification of logic systems.

BACKGROUND OF THE INVENTION

As electronic devices of all kinds continue to proliferate, the demand for the integrated circuits or "chips" that operate the devices also continues to expand. New functionality and integration of more functionality onto smaller and smaller chips, makes it very difficult to verify new chip designs in a timely and comprehensive manner to insure that new designs operate in accordance with a design specification and design rules. As transistor devices become smaller, and more chip functionality is demanded, more transistor devices are included within new integrated circuits, and the verification process becomes so immense that for many newly designed integrated circuit models, verification is a critical bottleneck in the design flow.

The traditional approach of verification of digital systems is simulation: generating sequences of inputs to apply to the model under test, then verifying by hand or with a correctness checker whether the digital system behaved properly under the simulation run. While this methodology is simple, it is unfeasible to fully verify designs as their complexity increases since this would require an exponential amount of simulation time; the amount of simulation which can be performed in a timely manner yields lower and lower total coverage as logic complexity increases.

As a consequence of this simulation coverage problem, formal verification has become more and more popular. Formal verification is the process of rigorously verifying that an implementation of a logic design satisfies its specification. Note that the goal of simulation is the same, but that simulation is not rigorous. Model checking is a very popular form of formal verification.

In model checking, one of the most time consuming efforts is to provide a behavioral environment that "models" the microarchitectural interface to the unit under test. Traditionally, this effort can take several months, and being a manual effort, it is error prone. Consequently, verification may begin much later than is desired, and much time can be wasted by the verification engineers and the designers trying to weed through these "false fails" generated by an erroneous environment.

A digital design is composed of a collection of "state machines" that implement a required functionality. A "state machine" may be defined as an abstract machine consisting of a set of states, (including the initial state), a set of inputs, a set of outputs and a state transition function. The transition function takes the current state and an input and returns a new set of outputs and the next state. Since there is a one-to-one correspondence between "output values" and "states", only "states" will be referred to in the following discussion. A state machine can also be considered as a function which maps an ordered sequence of input events into a corresponding sequence of states.

The state of a sequential digital design at a given point in time is the cross product of the states of the various state machines in the design. This is hereinafter referred to as the "product state machine". A state transition table, which lists the transition from the current state to the next state for a given input, can then define the full functionality of such a sequential design. However, the verification of a sequential design requires not just the verification of the state transitions, but also all of the valid sequences of state transitions that can be traversed by the integrated circuit (IC) design being checked. A model checking tool can provide verification of all sequences of state transitions. A sequence of state transitions is hereinafter referred to as a "walk" or a "trace". The terms "walk" and "trace" are used interchangeably.

Accordingly, there is a need for an enhanced method for automating the generation of an environmental behavioral input required for model checking the designs of integrated circuits.

SUMMARY OF THE INVENTION

A method is provided for enhancing verification of a design by using model checking on state transitions captured during simulation testing of the design. The methodology, in an exemplary embodiment, consists of utilizing the state transitions, and the inputs causing those state transitions (as observed during simulation) to define legitimate input values that can be applied, non-deterministically and exhaustively, by a model checker to the design under test.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Figures 1, 2:
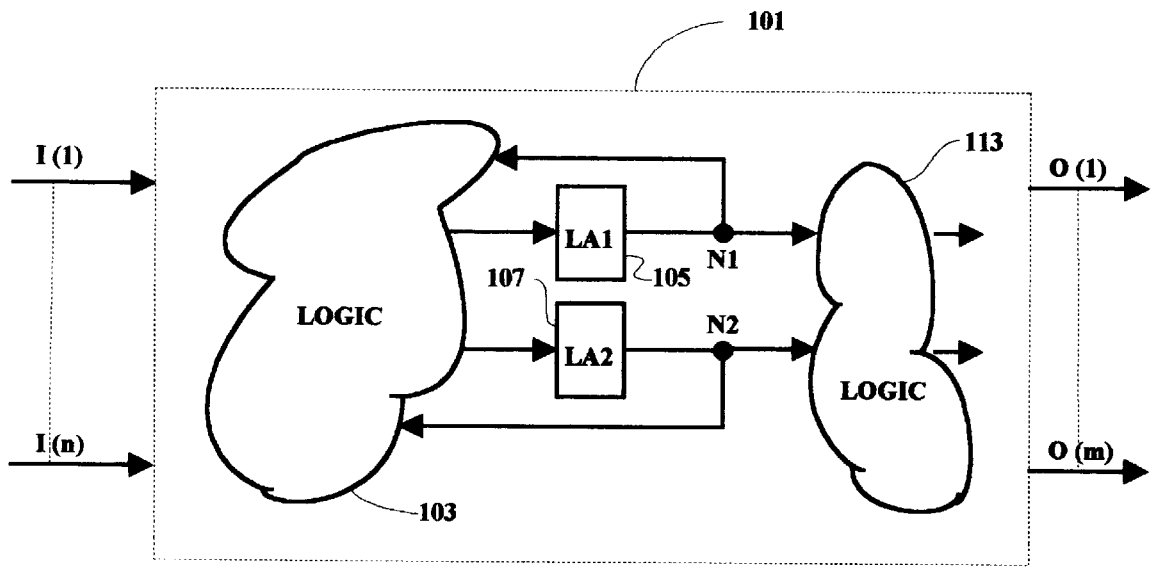
FIG. 1 is a simplified schematic diagram illustrating an exemplary circuit design useful in explaining the present invention.
FIG. 2 is an illustration showing various circuit state conditions as defined by the logic states at points or nodes within the circuit illustrated in FIG. 1.

The disclosed methodology is effectively implemented for coding the interface level formal environment. The methodology is based upon the finding that the transition table of the design under test can be constructed from observing its behavior under simulation, which, in turn, can be used to drive the inputs of the same design for model checking. This inverted transition table provides a restrictive but valid set of input constraints for model checking; every transition out of state "x" observed during simulation is encoded as a possible input vector that the formal environment can apply to the model under test when the model is in state "x". Given the transition table, model checking can exhaustively verify a design for all possible state transition "walks" or "traces" comprising the transitions observed in simulation, and therefore model checking can catch a potential "bug" or design problem which may manifest during these transition walks. Even though each individual transition performed by the model checker was captured from simulation, the simulation need not have exposed all of the actual walks possible given the transition relation (exposing all of these walks actually requires an exponential number of simulation runs, hence is unfeasible).

The transition table of the state machine of a design under test is captured by observing the input and state values on a cycle-by-cycle basis from the simulation trace file; at a simulation cycle "i", a given input I_i and a given state S_i are observed, and the state at cycle "i+1" completes the entry into the transition table. While for a given simulation run the product state machine may not exhibit all of the possible state transitions, after a large number of cycles, the majority of the legitimate transitions will be observed and recorded. Coverage analysis can be used to determine the percentage of the state transition edges which have been captured during the set of all simulations.

The state transition table so captured provides a function which gives, for each state, a list of input vectors that were exhibited during simulation at that state. The function can be used to drive the inputs of the design; the model checker will "nondeterministically" select from the possible input vectors for the given state. Note that simulation is "deterministic", i.e. for any given state "x" at cycle "i", the simulator will apply a single input vector fixed by the test case being run. Model checking is "nondeterministic", i.e. for a given state "x" at cycle "i", more than one possible transition exists and the model checker will explore all possible transitions out of this given state. By systematically exploring all possible transitions, the model checker considers all possible walks comprising the transition relation. Thus, checking specification in this model checking environment yields verification above that which was obtained from the simulation runs.

An advantage of the disclosed technique is that model checking can be started as soon as a functional model is available for simulation, which is generally the earliest stage at which model checking is applicable at the implementation level. The unit or product under test can be instrumented in the simulation environment (using a standard simulation trace facility) to collect cycle by cycle data on the latch values and the input signals to the design under test. The latches used in the design of the state machines can be extracted from the design source either automatically or by the designer. As more simulations are run, the additional data on the state transitions can be used to automatically add to the functionality of the inverted state machine that drives the unit under test in model checking. During this time, the development of a full functional formal environment can proceed as usual and can eventually replace the automatic model to provide coverage of the state transitions that may have been missed during the simulations. The automatic formal environment in combination with a model checker will provide more coverage than the simulations since in a simulation, a state transition trace or walk may not have been simulated but a model checker, with the automatically generated formal environment, will exhaustively check the specification against all possible traces comprising transitions seen in simulation, thus exposing "bugs" which may be present. The manual environment can provide the additional benefit that it can produce traces comprising transitions never seen in simulation, if such traces exist.

The simulation model can be large and complex and any sub-unit of the model can be selected for exhaustive verification by the disclosed method. A trace captured for a particular unit under test need not be the exact unit under simulation, but can be a sub-unit of lesser or equal size to the full simulation model. Often a simulation environment and test case generation tool is developed for a "system" comprising one or more units, and exhaustive simulation is performed upon the system using these tools. Transition relation data can be extracted for one or more sub-units of this large system model, eliminating the need to build separate simulation environments and test case generation tools for each individual sub-unit.

In FIG. 1 there is shown a circuit 101 under test which receives inputs I(1) through I(n) and provides outputs O(1) through O(m) with no particular relationship between like numbers of inputs and outputs. The circuit under test 101 includes logic arrays 103 and 113 for example, and latches LA1 105 and LA2 107 connected between the logic circuits 103 and 113. As the inputs to the circuit 101 are changed, the states of the latch devices LA1 and LA2 may also change; the "next state" for these latches (i.e., the value that these latches will assume when triggered) is a function of their present values and the inputs. The latches 105 and 107 may each be one of two possible "1" or "0" logic states and accordingly there are four possible states i.e. state "a", state "b", state "c" and state "d", for the latch combination 105 and 107. These states are shown in table form in FIG. 2. Outputs from the latches 105 and 107 are shown connected to nodes N1 and N2 which are in turn applied to the first logic array 103 and the second logic array 113. Output signals O(1) through O(m) are provided from the second logic array 113. In some cases, O(1) through O(m) are functions not only of the present state N1 and N2 but also of present inputs I(1) through I(n). These cases are referred to as "Mealy" machines, and the techniques disclosed herein apply also to these machines.

Figures 3, 4:
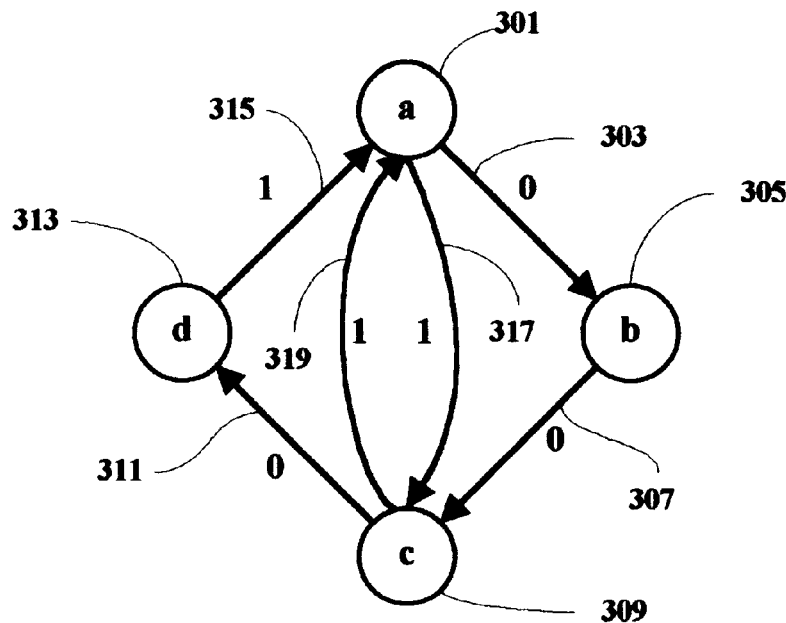
FIG. 3 is an exemplary state transition diagram showing transition paths between various states of a state machine.
FIG. 4 is an exemplary transition relation table illustrating the changing of states with changing inputs.

In FIG. 3, an exemplary state transition diagram is illustrated. A state transition diagram is a diagram consisting of circles to represent states and directed line segments to represent transitions between the states. One or more actions or outputs may be associated with each transition and/or state. The diagram illustrated represents a finite state machine or "FSM". As shown, there are four states: state "a" 301, state "b" 305, state "c" 309 and state "c" 313. In the example, from state "a" 301, a logic "0" input will change or transition 303 the state of the state machine to state "b" 305. From state "b" 305, a logic "0" input will cause a state transition 307 or change to state "c" 309. From state "c" 309, a "1" input will cause a transition 319 to state "a" 301, and a "0" input will cause a transition 311 to state "d" 313. From state "d" 313, a logic "1" will cause a state change or transition 315 to state "a" 301. From state "a" 301, a logic "1" input will cause a transition 317 to state "c" 309.

To illustrate a benefit from the present methodology, in FIG. 3, assume a simulation causes the following state transition "walks": "a-b-c-d-a" and "a-c-a", by running the following test case: "0-0-0-1-1-1". It follows from the observed transitions that it is possible to create walks "a-b-c-a" and "a-c-d-a", though they were not observed in the simulation. If walk "a-b-c-a" illustrates a bug, even though it was not observed in simulation, our automatic formal environment will illustrate to the model checker that, based on the observed walks "a-b-c-d-a" and "a-c-a", it may nondeterministically select between two input values to choose at state "c", and therefore will automatically explore "a-b-c-a". If a rule were available to check for the error from this walk, it will be caught.

Figures 5, 6:
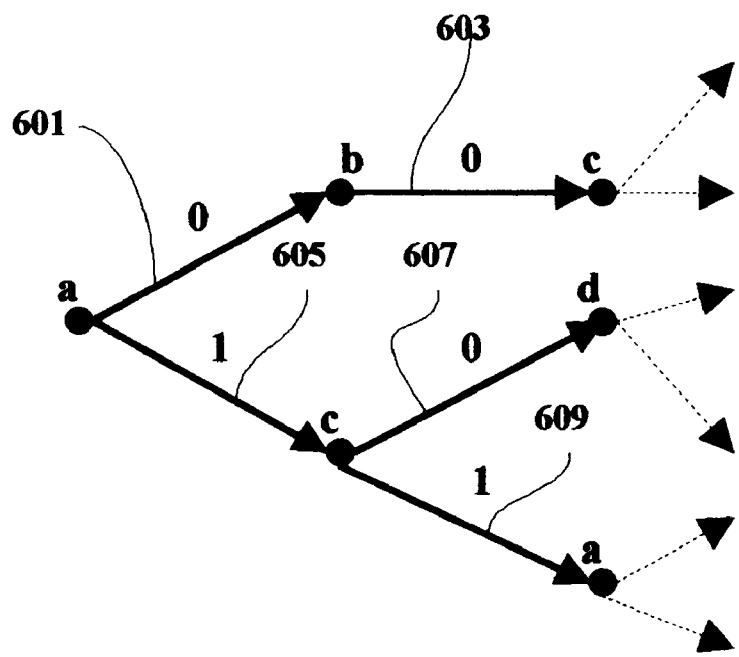
FIG. 5 is a table illustrating a recordation of "traces" accomplished during simulation.
FIG. 6 is an illustration showing several exemplary traces among circuit states as various input signals are applied.

The Transition Relation table for the state machine illustrated in FIG. 3 is shown in FIG. 4. This table is typically developed from simulation runs by applying input vectors and observing the resulting state machine transitions. FIG. 5 illustrates the traces obtained by two simulation runs. Both state bits and input bits are traced at every cycle (clock). Each state-input pair at clock "i", combined with the resulting state at clock "i+1", comprise an entry to the transition relation table. Note that each (current state, current input, next state) triplet need only be recorded once; hence there may be much redundancy between or even within simulation traces.

FIG. 6 shows the "walks" that the model checker program will explore. As per the transitions seen in simulation in FIG. 5 (illustrated in FIG. 3), from state "a" the model checker will be able to choose from inputs "0" and "1", which cause transitions 601 and 605 to states "b" and "c", respectively. From state "c", a "0" input causes a transition 607 to state "d" and a "1" input causes a transition 609 to state "a". Each possible path found to exist is called a "trace" or a "walk". For example, with reference to FIG. 6, one "trace" would include the path from state "a" to state "b" to state "c" and so on. Another trace would include "a-c-d" and a third trace would include "a-c-a". Each different "path" through the various states constitutes a different trace. While each simulation run corresponds to a single straight path of a series of transitions in this "tree" of transitions, by utilizing nondeterministic selections of legitimate inputs on a perstate basis, our automatic formal environment enables the model checker to explore all possible walks comprising the transitions seen in simulation; the model checker will explore all possible paths or "branches", as shown in FIG. 6, in parallel.

Figure 7:
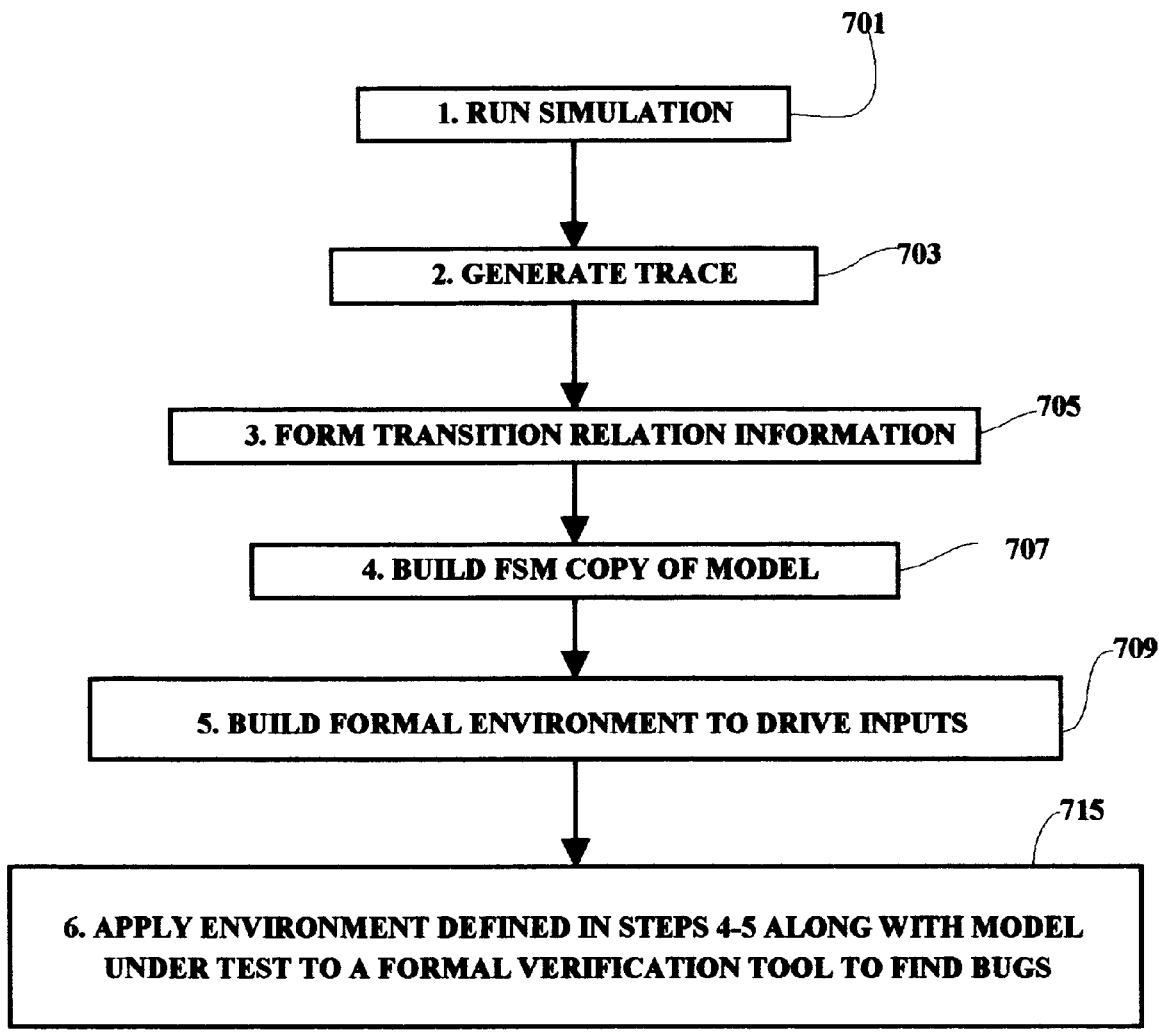
FIG. 7 is a flow chart illustrating the overview of the method for automatic generation of a formal environment from simulation traces.

FIG. 7 shows a flow chart for accomplishing the methodology disclosed herein. In FIG. 7, the first step in the process is shown as the "Run Simulation" function 701. For example, the design represented by the state diagram shown in FIG. 3 would be run under a simulator to exercise the possible state transitions. The next step is the trace generation 703 after which the transition relation information is formed 705. The trace generation step simply captures the input and state information as observed during the simulation.

Thereafter, a FSM (finite state machine) copy of the model is derived from this information as shown by step 707. This FSM copy can be expressed as a graph as in FIG. 3 or as a table as in FIG. 4. Next, a formal environment is built to drive inputs to the FSM as indicated in 709. This formal environment defines, on a per-state basis, what legitimate inputs can be driven. For example, using the data of FIG. 4, from present state ="a", inputs "0" (which takes the state machine to next state "b") or "1" (which takes the state machine to the next state "c") can be driven; from state "b", only input "0" (which takes us to next state "c") can be driven. Basically, the definitions created in 709 are to be used by the model checker to determine which input values can be applied to the model at any given cycle (as determined from the state of the FSM copy of the model from step 707, which shadows the transitions of the actual model), and the way that the model checker achieves this is by applying legitimate values to the inputs of the model (as determined from the definition in 709). Model checking can, in this respect, be thought of as nondeterministic simulation, i.e. at any given cycle, the model checker may apply one of a set of values to the model's inputs (every possible choice will be considered by the model checker). Thereafter, the environment defined in steps 707 and 709, along with the model under test, may be applied to a formal verification tool to find bugs in the design as indicated by step 715.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art, and even included or integrated into a processor or CPU or other larger system integrated circuit or chip. The methodology may also be implemented solely in program code stored on a CD, disk or diskette (portable or fixed), or other memory or storage device, from which it may be executed to function as described herein. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for processing information to provide a behavioral environment for use in model checking of a logic design, said method comprising:

performing a simulation testing of the logic design using simulation input signals;

identifying state transitions resulting from said simulation testing, said state transitions being actual transitions observed during said simulation testing; and using said state transitions in providing a model input environment for a model checking process of the logic design.

2. The method as set forth in claim 1 and further including:

building a state transition table from said state transitions; and expanding said state transition table to provide an expanded set of model inputs to comprise said model input environment.

3. The method as set forth in claim 2 wherein said model inputs comprising said model input environment are developed by expanding from said transition table in a non-deterministic manner.

4. The method as set forth in claim 2 wherein said step of building said transition table comprises:

identifying every transition out of every state observed during said simulation testing; and encoding said transitions out to provide an identification of possible input vectors for said model input environment.

5. The method as set forth in claim 4 wherein said step of identifying transitions further includes:

identifying simulation input and simulation state values on a cycle-by-cycle basis from said simulation transition table.

6. The method as set forth in claim 4 and further including:

selecting predetermined ones of said input vectors in providing said expanded set of inputs in said model input environment.

7. The method as set forth in claim 6 wherein all of said input vectors are used in providing said model input environment.

8. The method as set forth in claim 3 wherein said step of building said transition table comprises:

identifying every transition out of every state observed during said simulation testing; and encoding said transitions out to provide an identification of possible input vectors for said model input environment.

9. The method as set forth in claim 8 wherein said step of identifying transitions further includes:

identifying simulation input and simulation state values on a cycle-by-cycle basis from said simulation transition table.

10. The method as set forth in claim 8 and further including:

selecting predetermined ones of said input vectors in providing said expanded set of inputs in said model input environment.

11. The method as set forth in claim 10 wherein all of said input vectors are used in providing said model input environment.

12. A storage medium including machine readable indicia, said storage medium being selectively coupled to a reading device, said reading device being selectively coupled to processing circuitry within a processing system, said reading device being selectively operable to read said machine readable indicia and provide program signals representative thereof, said program signals being effective to cause said processing circuitry to process information to provide a behavioral environment for use in model checking of a logic design by performing the steps of:

performing a simulation testing of the logic design using simulation input signals;

identifying state transitions resulting from said simulation testing, said state transitions being actual transitions observed during said simulation testing; and using said state transitions in providing a model input environment for a model checking process of the logic design.

13. The medium as set forth in claim 12 wherein said program signals are further effective for:

building a state transition table from said state transitions; and expanding said state transition table to provide an expanded set of model inputs to comprise said model input environment.

14. The medium as set forth in claim 13 wherein said model inputs comprising said model input environment are developed by expanding from said transition table in a non-deterministic manner.

15. The medium as set forth in claim 13 wherein said program signals are further effective for:

identifying every transition out of every state observed during said simulation testing; and encoding said transitions out to provide an identification of possible input vectors for said model input environment.

16. The medium as set forth in claim 15 wherein said program signals are further effective for:

identifying simulation input and simulation state values on a cycle-by-cycle basis from said simulation transition table.

17. The medium as set forth in claim 15 wherein said program signals are further effective for:

selecting predetermined ones of said input vectors in providing said expanded set of inputs in said model input environment.

18. The medium as set forth in claim 17 wherein all of said input vectors are used in providing said model input environment.

19. The medium as set forth in claim 14 wherein said step of building said transition table comprises:

identifying every transition out of every state observed during said simulation testing; and encoding said transitions out to provide an identification of possible input vectors for said model input environment.

20. The medium as set forth in claim 19 wherein said step of identifying transitions further includes:

identifying simulation input and simulation state values on a cycle-by-cycle basis from said simulation transition table.

21. The medium as set forth in claim 19 wherein said program signals are further effective for:

selecting predetermined ones of said input vectors in providing said expanded set of inputs in said model input environment.

22. The medium as set forth in claim 21 wherein all of said input vectors are used in providing said model input environment.

23. The method as set forth in claim 1 wherein the model is comprised of a plurality of sub-units, said state transitions for the model being extracted from said sub-units of said model.

24. The medium as set forth in claim 12 wherein the model is comprised of a plurality of sub-units, said state transitions for the model being extracted from said sub-units of said model.

* * * * *